United States Patent
Ackerman et al.

(10) Patent No.: US 6,862,394 B2
(45) Date of Patent: Mar. 1, 2005

(54) WAVELENGTH TUNABLE LASER AND METHOD OF FORMATION

(75) Inventors: David A. Ackerman, Hopewell, NJ (US); John E. Johnson, New Providence, NJ (US); David V. Lang, Madison, NJ (US); C. Lewis Reynolds, Jr., Sinking Spring, PA (US)

(73) Assignee: Triquint Technology Holding Co., Hillsboro, OR (US)

( * ) Notice: Subject to any disclaimer, the term of this patent is extended or adjusted under 35 U.S.C. 154(b) by 103 days.

(21) Appl. No.: 10/036,437

(22) Filed: Jan. 7, 2002

(65) Prior Publication Data

US 2003/0128950 A1 Jul. 10, 2003

(51) Int. Cl.$^7$ ................................................ G02B 6/10
(52) U.S. Cl. ...................... 385/131; 385/130; 385/141; 372/7
(58) Field of Search ................................ 385/131, 129, 385/130, 132, 141; 372/7

(56) References Cited

U.S. PATENT DOCUMENTS

| | | | | | |
|---|---|---|---|---|---|
| 5,740,193 | A | * | 4/1998 | Okuyama et al. | 372/45 |
| 5,912,475 | A | * | 6/1999 | Itagaki et al. | 257/94 |
| 6,198,853 | B1 | * | 3/2001 | Yamada | 385/2 |
| 6,525,348 | B1 | * | 2/2003 | Scott et al. | 257/187 |
| 6,529,541 | B1 | * | 3/2003 | Ueki et al. | 372/96 |
| 2002/0072142 | A1 | * | 6/2002 | Ooi et al. | 438/46 |
| 2002/0104997 | A1 | * | 8/2002 | Kuo et al. | 257/79 |
| 2003/0080337 | A1 | * | 5/2003 | Yudasaka et al. | 257/59 |
| 2003/0128734 | A1 | * | 7/2003 | Kamath | 372/96 |

FOREIGN PATENT DOCUMENTS

JP          60065588 A    *    4/1985    ............. H01S/3/18

* cited by examiner

Primary Examiner—Rodney Bovernick
Assistant Examiner—Sung Pak
(74) Attorney, Agent, or Firm—Dickstein Shapiro

(57) ABSTRACT

A method of increasing the monomolecular recombination and the immunity to noise of a continuously tunable laser is disclosed. A concentration of recombination centers in the range of about $1 \times 10^{16}$ cm$^{-3}$ to about $1 \times 10^{18}$ cm$^{-3}$ in the tuning region of the laser device is achieved by doping the waveguide layer with impurity atoms, by irradiating the waveguide layer with high energy particles or by varying the growth conditions of the waveguide layer to introduce native point defects due to lattice mismatch. This way, the monomolecular recombination is increased and the radiative recombination over low current ranges is reduced. By increasing the monomolecular recombination, the immunity to noise is improved but the tuning efficiency is reduced. Nevertheless, only a minimal effect on the tuning efficiency is noted over high current ranges and, therefore, the overall tuning range is only insignificantly changed.

19 Claims, 10 Drawing Sheets

US 6,862,394 B2

WAVELENGTH TUNABLE LASER AND METHOD OF FORMATION

FIELD OF THE INVENTION

The present invention relates to the field of semiconductor devices and, in particular, to a method for forming wavelength tunable lasers with increased immunity to noise.

BACKGROUND OF THE INVENTION

Semiconductor laser devices with a tunable wavelength are increasingly important as light sources for advanced lightwave communications systems, for example, for wavelength division multiplexed (WDM) systems. A type of a tunable laser diode is a three-section distributed Bragg reflector (DBR) laser, which is schematically illustrated in FIG. 1. As shown in FIG. 1, a DBR laser 10 includes a tuning region 12 with a tuning waveguide 13a and grating 13b and, possibly, a facet coating 16. The DBR laser 10 further includes a phase-tuning section 12b and a phase-tuning waveguide 13c. A gain section 14 with an active waveguide 14a, typically containing a multi-quantum well (MQW) stack, generates spontaneous emission and optical gain about an energy determined by the quantum well structure. With application of electrical current to electrodes 17 and 18, a threshold is reached beyond which sufficient gain and optical feedback from mirror 19 and the distributed Bragg reflector formed by 13a and 13b promotes laser action.

Optimization of lasing action in tunable sources, such as the DBR laser 10 of FIG. 1, requires increased tuning efficiency, narrow linewidth and immunity to noise. Tuning efficiency is defined as the rate of frequency change for a given change of tuning current to a tunable laser. The tuning range, which is defined as the range of wavelengths over which the laser can tune for a given amount of tuning current, is defined as the integral of the tuning efficiency over the range of tuning current. The tuning range may be quantified as a function of the number of tuning steps over which a laser device lases. For example, FIG. 2 illustrates the output wavelength of light from a laser device as a function of the current injected in the tuning region 12 of the laser. As shown diagrammatically in FIG. 2, over a tuning current range of about 0.1 mA to about 20 mA, the laser can tune in eight (8) tuning steps over about 4 nm wavelength tuning range (the difference between 1551 nm and 1547 nm).

Optimization of the tuning range requires a large or broad tuning range of the laser device because, with a large tuning range, a tunable laser can produce a wide variety of output frequencies. As known in the art, broad tuning range is conferred by a high sensitivity of the effective refractive index of the tuning section to variations in the tuning current. Nevertheless, the same high sensitivity of refractive index that provides a large tuning range also renders a tunable laser susceptible to shot noise, current noise and external optical reflection noise.

The change of refractive index of the tuning section is substantially linear with the density of carriers injected into the waveguide layer of tuning region 12. In turn, the carrier density is related to the injection current by the recombination equation (1):

$$I/qV = An + Bn^2 + Cn^3 \qquad (1)$$

where,
I=the intensity of injected current;
q=the electron charge;
V=the volume of the tuning waveguide layer;
A=linear coefficient;
B=quadratic coefficient;
C=cubic coefficient; and
n=the density of the injected carriers.

The linear coefficient A of equation (1) is associated with monomolecular recombination, which in turn is due to non-radiative recombination through traps, damage or defects in the material, for example, and produces a dominant effect at low current densities. The quadratic coefficient B is associated with radiative bimolecular recombination, which produces spontaneous emission of light, while the cubic coefficient C is associated with non-radiative Auger recombination. Radiative and Auger recombination dominate over monomolecular recombination at high carrier densities.

Recently, efforts have been made at optimizing the tuning efficiency and the tuning range in tunable lasers and at minimizing the noise, for example, the shot noise and the current supply noise. According to equation (1), the change of carrier density with current, and therefore the tuning efficiency, is greatest at low carrier density and decreases with increasing current. Recent studies have proposed heavy doping of the waveguide layer of tuning region 12 to increase the recombination rate of carriers. This method increases the background carrier density in the waveguide layer to a high enough level so that radiative and Auger are the dominant recombination mechanisms, thus avoiding the region of high tuning efficiency at low carrier density. Nevertheless, because the carrier density is already high at zero current, this approach dramatically reduces the range over which the carrier density may be changed, resulting in a dramatic reduction in tuning range.

Accordingly, there is a need for an improved method for increasing the immunity to noise of a tunable device without compromising the tuning range. There is also a need for a tunable laser that can be easily integrated with WDM components and that has increased immunity to noise as well as large tuning range.

BRIEF SUMMARY OF THE INVENTION

The present invention provides a method for improving the immunity to noise of a tunable laser, such as a DBR laser. According to the present invention, immunity to noise is greatly increased by providing a small density of recombination centers, about $1 \times 10^{16}$ cm$^{-3}$ to about $1 \times 10^{18}$ cm$^{-3}$, in the tuning region of the laser. In one embodiment, the recombination centers are created by lightly doping the material of the tuning region with elements that form energy levels deep in the bandgap of the material. In another embodiment, the recombination centers are formed in the tuning region by irradiation with high energy particles. In yet another embodiment, native point defects due to lattice mismatch are formed in the tuning region and act as centers for monomolecular recombination of carriers. The recombination centers increase monomolecular recombination, which affects the tuning efficiency predominantly at low currents at which tuning efficiency and sensitivity to noise are observed to be highest. By increasing the monomolecular recombination, the tuning efficiency at low currents is reduced and the immunity to noise is improved. The tuning range is also reduced; however, since the tuning efficiency at high currents is only minimally affected by monomolecular recombination, the overall tuning range is only insignificantly changed.

These and other advantages and features of the invention will be more clearly understood from the following detailed

DETAILED DESCRIPTION OF THE INVENTION

Figure 1:
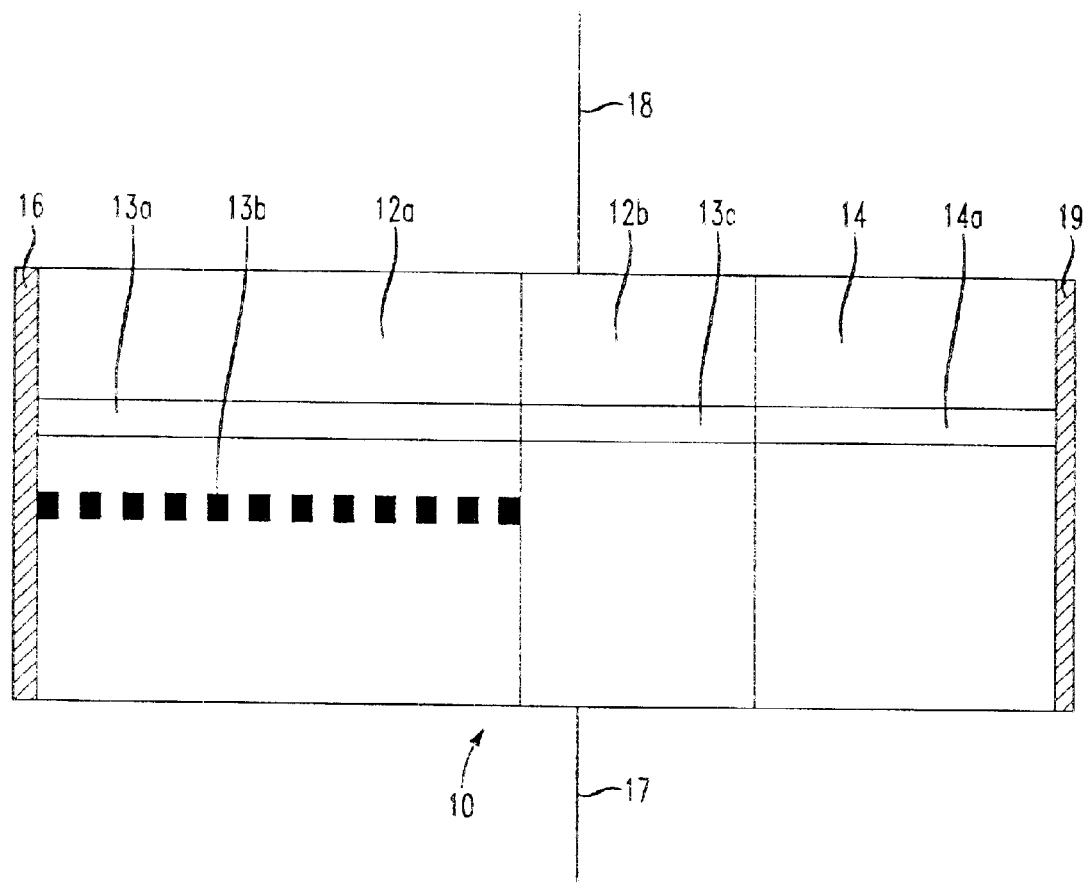
FIG. 1 illustrates a schematic view of a conventional two-section laser device.
Figure 2:
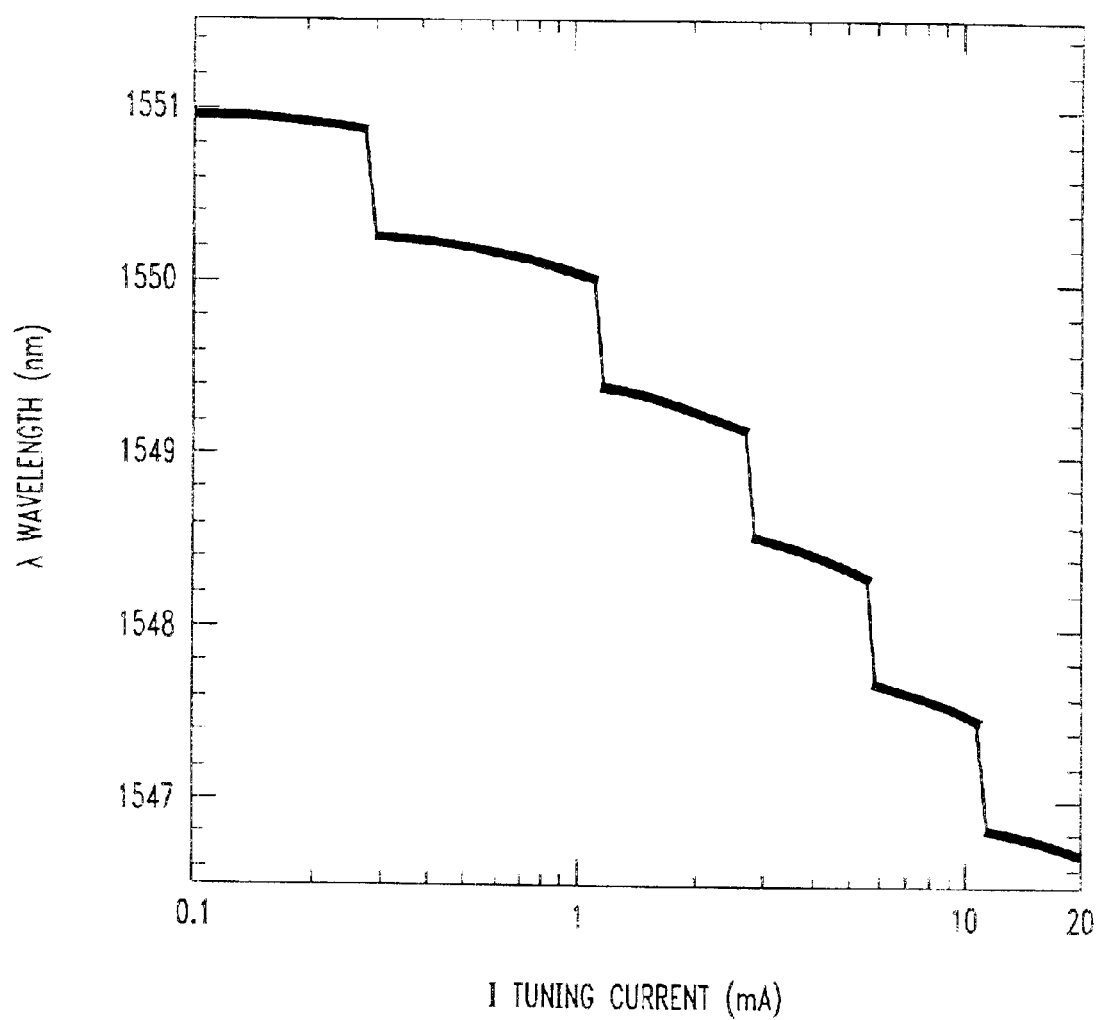
FIG. 2 illustrates the output wavelength as function of the tuning current for the two-section laser device of FIG. 1.

In the following detailed description, reference is made to various specific embodiments in which the invention may be practiced. These embodiments are described with sufficient detail to enable those skilled in the art to practice the invention, and it is to be understood that other embodiments may be employed, and that structural, electrical and methodology changes may be made and equivalents substituted without departing from the invention. Accordingly, the following detailed description is not to be taken in a limiting sense and the scope of the present invention is defined by the appended claims.

Referring now to the drawings, where like elements are designated by like reference numerals, FIGS. 3–15 illustrate an exemplary embodiment of a semiconductor laser device 100 (FIG. 15) having a tuning region 70 (FIG. 15) formed according to the present invention. Although FIGS. 3–15 illustrate the formation of a two-section DBR laser having a tuning region with a grating below it, the invention is not limited to this embodiment and it contemplates the formation of tuning sections without gratings, for example, the formation of a phase-tuning section of a three-section DBR laser. Accordingly, the exemplary embodiment described below is only illustrative and the present invention is not limited to the details of such specific and exemplary embodiment.

Figure 3:
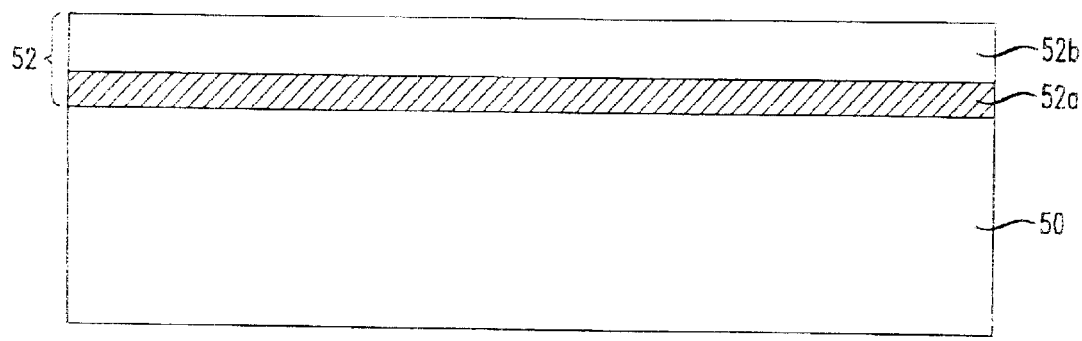
FIG. 3 illustrates a cross-sectional view of a laser device formed in accordance with one embodiment of the present invention.

FIG. 3 depicts a portion of a semiconductor laser bar in the tuning region comprising an n-InP substrate 50, an InGaAsP quaternary (Q) grating layer 52a and an n-InP fill-in layer 52b formed over the n-InP substrate 50. For simplicity of the invention, reference to the Q-grating layer 52a and the n-InP fill-in layer 52b will be made as to layers 52.

Figure 4:
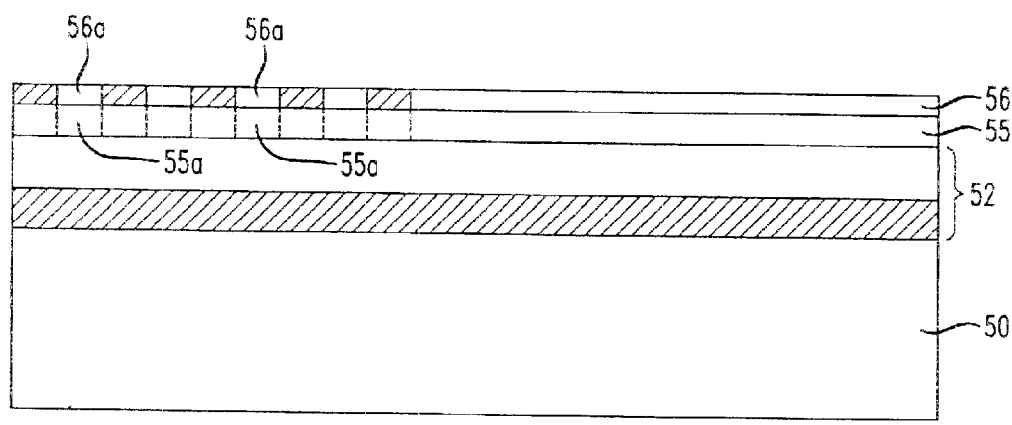
FIG. 4 illustrates a cross-sectional view of the laser device of FIG. 3 at a stage of processing subsequent to that shown in FIG. 3.

A photoresist layer 55 is formed over the layers 52, as shown in FIG. 4. The photoresist layer 55 is exposed through a mask 56 (FIG. 4) with high-intensity UV light. The mask 56 may include any suitable pattern of opaque and clear regions that may depend, for example, on the desired pattern to be formed in the layers 52. This way, portions 55a of the photoresist layer 55 are exposed through portions 56a of the mask 56 wherever portions of the layers 52 need to be removed.

Figure 5:
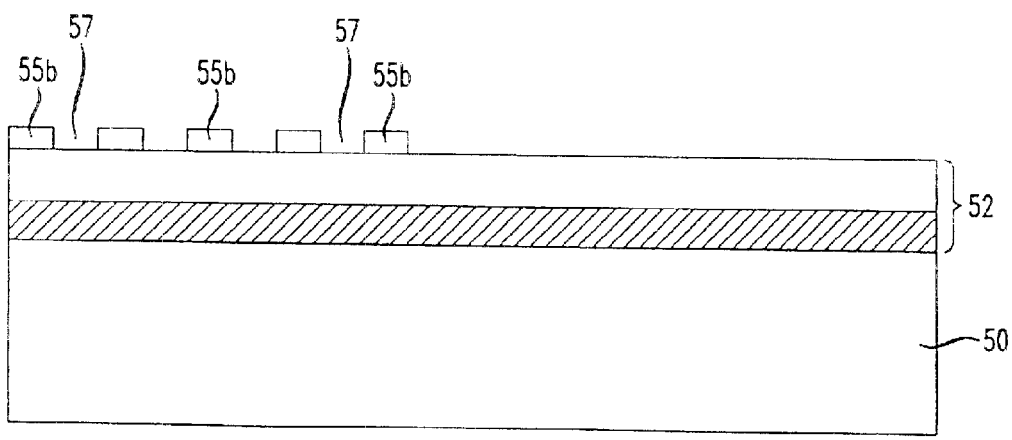
FIG. 5 illustrates a cross-sectional view of the laser device of FIG. 3 at a stage of processing subsequent to that shown in FIG. 4.
Figure 6:
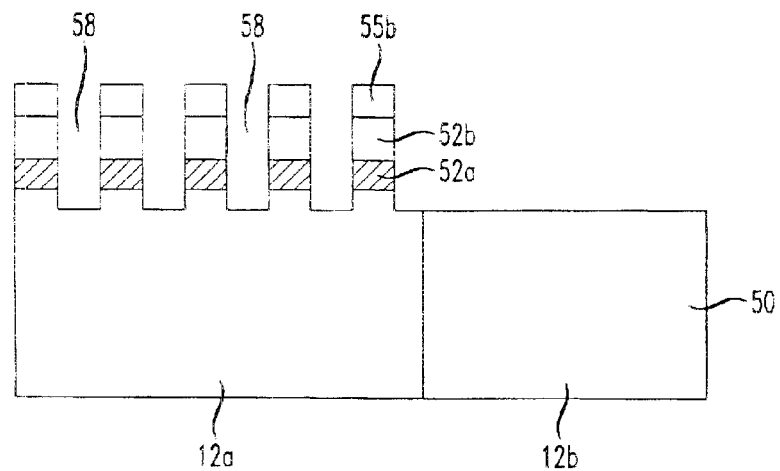
FIG. 6 illustrates a cross-sectional view of the laser device of FIG. 3 at a stage of processing subsequent to that shown in FIG. 5.

Although FIG. 4 schematically illustrates mask 56 positioned over the photoresist layer 55, those skilled in the art will appreciate that mask 56 is typically spaced from the photoresist layer 55 and light passing through mask 56 is focussed onto the photoresist layer 55. After exposure and development of the exposed portions 55a, portions 55b of the unexposed and undeveloped photoresist are left over the layers 52, as shown in FIG. 5. This way, openings 57 (FIG. 5) are formed in the photoresist layer 55. Those skilled in the art will recognize that the patterning of openings in photoresist layer 55 may be accomplished by other methods than using the mask 56, for example, by optical holography or by electron beam lithography.

An etch step is next performed to obtain grooves 58 (FIGS. 6–7) in the layers 52 and to complete the formation of a grating region 60 (FIG. 7) of the tunable laser device 100 formed according to the present invention. The grooves 58 (FIG. 6) are etched to a depth of about 500 Angstroms below the bottom of the layers 52. Subsequent to the formation of the grooves 58, the remaining portions 55b (FIG. 6) of the positive photoresist layer 55 are removed by chemicals, such as hot acetone or methylethylketone, or by flooding the substrate 50 with UV irradiation to degrade the remaining portions 55b to obtain the grating region 60 of FIG. 7.

Figure 7:
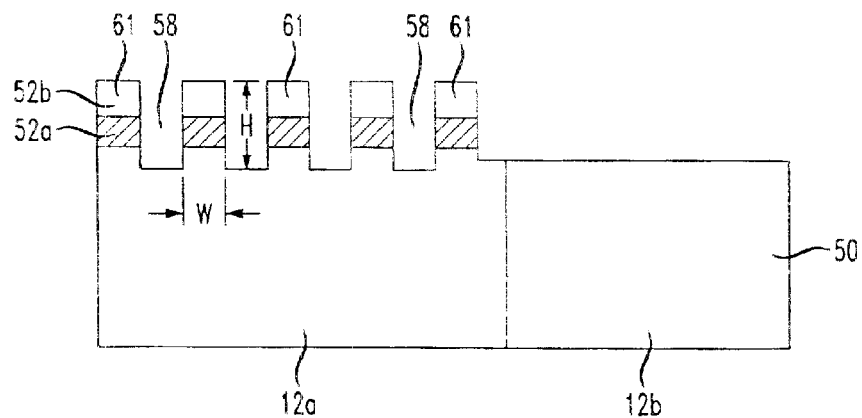
FIG. 7 illustrates a cross-sectional view of the laser device of FIG. 3 at a stage of processing subsequent to that shown in FIG. 6.
Figure 8:
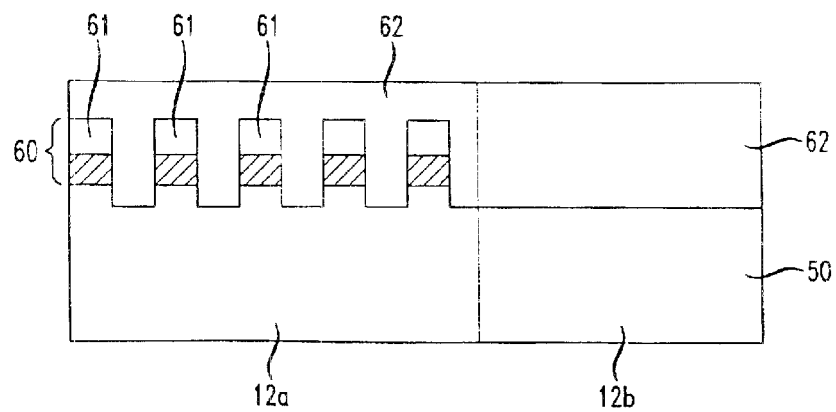
FIG. 8 illustrates a cross-sectional view of the laser device of FIG. 3 at a stage of processing subsequent to that shown in FIG. 7.

The grooves 58 are patterned and etched into the layers 52 to form a variety of grating structures or teeth 61, also shown in FIG. 7. Each of the grating structure 61 has a height (H) (FIG. 7) of about 500 Angstroms to about 1,000 Angstroms and a width (W) (FIG. 7) of about 1,000 Angstroms to about 2,000 Angstroms. For simplicity, FIG. 7 illustrates only five grating structures or teeth 61. It must be understood, however, that a tuning region of a tunable laser device may comprise many more grating structures or teeth.

Subsequent to the formation of the grating region 60 having the plurality of grating structures 61 of FIG. 7, a first cladding layer 62, for example an n-InP layer 62, is epitaxially grown over the grating region 60, as illustrated in FIG.

8. Although the Metalorganic Vapor Phase Epitaxy (MOVPE) method is preferred for the formation of the first n-InP layer 62, any suitable growth technique could also be used as an alternative. In an exemplary embodiment of the present invention, the first n-InP layer 62 is epitaxially grown up to a thickness of about 300 Angstroms to about 800 Angstroms by the MOVPE method.

Figure 9:
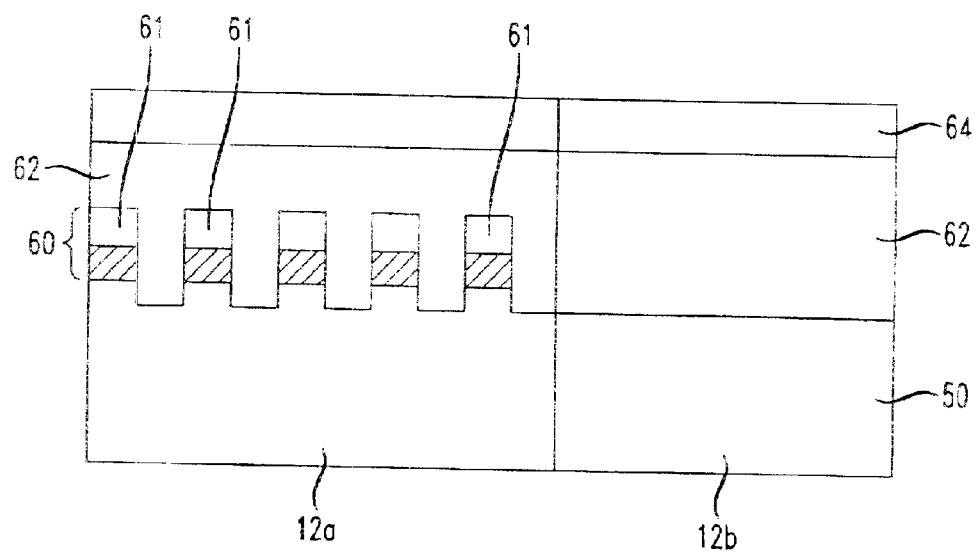
FIG. 9 illustrates a cross-sectional view of the laser device of FIG. 3 at a stage of processing subsequent to that shown in FIG. 8.

Next, as illustrated in FIG. 9, a first quaternary (Q) layer 64 is formed over the first n-InP layer 62. In an exemplary embodiment of the present invention, the first quaternary (Q) layer 64 is an InGaAsP waveguide layer which is epitaxially grown by either MOVPE or other suitable method to a thickness of 500 Angstroms to about 3,000 Angstroms, more preferably of about 2,000 Angstroms. For the purposes of the present invention, reference will be made to the first quaternary (Q) layer 64 as being an InGaAsP waveguide layer 64, but it must be understood that other known semiconductor materials may be used also for the formation of the first quaternary (Q) layer 64, and thus the invention is not limited to InGaAsP as the material of choice for the first quaternary (Q) layer 64.

Figure 10:
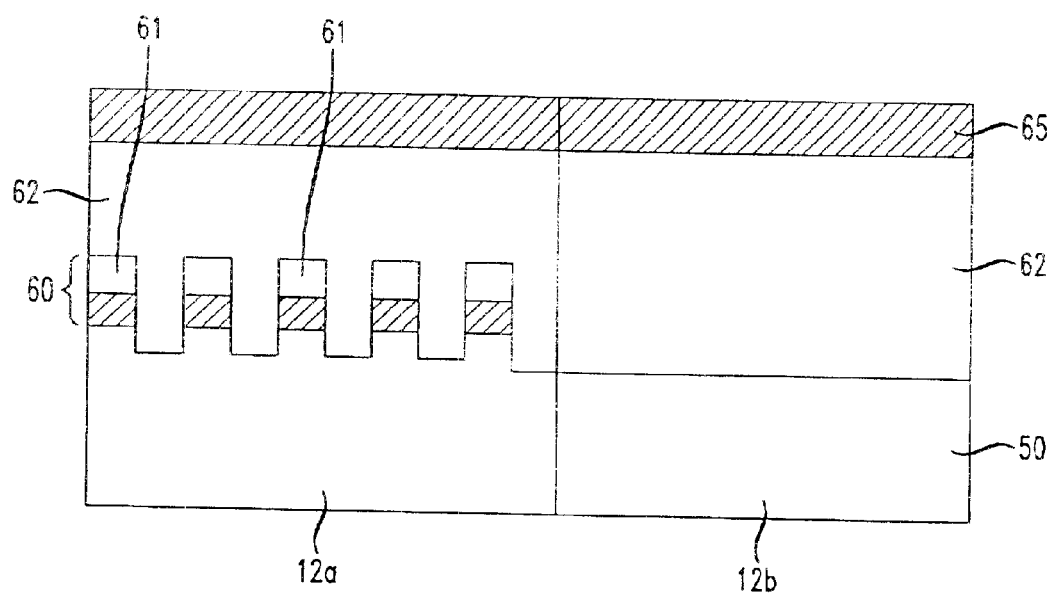
FIG. 10 illustrates a cross-sectional view of the laser device of FIG. 3 at a stage of processing subsequent to that shown in FIG. 9.

According to a first exemplary embodiment of the invention, the InGaAsP waveguide layer 64 is lightly doped with a deep-level impurity, i.e., a dopant that forms energy levels deep in the bandgaps of the material. When activated, these dopants enhance monomolecular recombination in the InGaAsP waveguide layer 65 (FIG. 10). The dopant may be iron (Fe), chromium (Cr), manganese (Mn), copper (Cu), or any other dopant known to increase monomolecular recombination in the InGaAsP waveguide layer 64 (FIG. 9). The dopants are typically activated using a thermal process. One skilled in the art is well aware of the temperatures required to activate dopants. Thus, thermal activation is not discussed in detail herein.

According to an exemplary embodiment of the invention, doping of the InGaAsP waveguide layer 64 may occur throughout, or a portion of, the InGaAsP waveguide layer 64. However, the invention is not limited to this embodiment and the invention also contemplates doping of only a portion, or of a plurality of portions, of the InGaAsP waveguide layer 64, as desired. According to an embodiment of the present invention, the InGaAsP waveguide layer 64 is intrinsic, but the InGaAsP waveguide layer 64 may be additionally doped with well-known donor or acceptor elements to make it n-type or p-type, respectively. The donor or acceptor concentration should be below about $5 \times 10^{17}$ cm$^{-3}$, so that efficient carrier injection into substantially all of InGaAsP waveguide layer 64 is obtained, and the tuning range is not significantly reduced by the large background carrier density.

According to an embodiment of the invention, doping of the InGaAsP waveguide layer 64 is simultaneously conducted while the InGaAsP waveguide layer 64 is epitaxially grown. For example, if iron (Fe) is the deep-level impurity of choice, doping can be conducted with an iron source such as bis(cyclopentadienyl) iron in the same reactor chamber where the epitaxial growth takes place, at a temperature of about 600° C. to about 700° C., at a pressure of about 60 Torr, and with a carrier gas such as H$_2$ for example.

Although, for a better understanding of the invention, the InGaAsP waveguide layer 64 is depicted as a different layer from the doped InGaAsP waveguide layer 65, it must be understood that, according to the first exemplary embodiment of the invention and as described above, the doping is performed simultaneously with the actual growth of the InGaAsP waveguide. Nevertheless, the invention is not limited to the simultaneous growth/doping of the waveguide and the present invention contemplates other embodiments. For example, the iron can be implanted using well-known ion implantation techniques subsequent to the growth of the InGaAsP waveguide layer 64.

A key aspect of the invention is that the doping of the InGaAsP layer 64 is a very light doping. If iron (Fe) is the deep-level impurity of choice, the InGaAsP layer 64 or a portion thereof is very lightly doped with iron having a dopant concentration in the range of about $1 \times 10^{16}$ cm$^{-3}$ to about $1 \times 10^{18}$ cm$^{-3}$, more preferably of about $2 \times 10^{16}$ cm$^{-3}$ to about $2 \times 10^{17}$ cm$^{-3}$. For the purposes of the present invention, the term "lightly doped" or "light doping" is defined as doping with a dopant to achieve a recombination centers concentration in the range of about $1 \times 10^{16}$ cm$^{-3}$ to about $1 \times 10^{18}$ cm$^{-3}$. Note that, for the embodiment in which iron is the dopant, there is approximately a 1:1 relationship between the concentration of iron and the concentration of recombination centers. For other dopants, the relationship between the dopant concentration and the concentration of the recombination centers may vary depending upon the amount of dopant that is activated, among other factors. One skilled in the art can readily ascertain the dopant concentration required to obtain the recombination centers within the prescribed range for a particular dopant.

Increased monomolecular recombination may be achieved by doping as little as 10 nm of the waveguide or by uniformly doping the entire waveguide. In an exemplary embodiment of the invention, 20–60 nm of the waveguide is doped with iron.

According to a second exemplary embodiment of the invention, subsequent to the growth of the InGaAsP waveguide layer 64, a small density of recombination centers are formed in the InGaAsP waveguide layer 64 by irradiation with high energy particles. The particles may be ions, such as hydrogen, helium, deuterium, oxygen or nitrogen, or they may be atomic particles such as electrons or neutrons. Beams of high energy particles may be produced for this purpose by any of the several well known means, for example, commercial ion implantation apparatus. The high energy particles are directed into at least a portion of the InGaAsP waveguide layer 64, where they deposit their kinetic energy into the crystal lattice of the InGaAsP. This deposited energy causes defects in the InGaAsP waveguide layer 64, which act as centers for monomolecular recombination of carriers, to form irradiated waveguide 65. As in the first exemplary embodiment, the concentration of recombination centers is in the range of about $1 \times 10^{16}$ cm$^{-3}$ to about $1 \times 10^{18}$ cm$^{-3}$, more preferably in the range of about $2 \times 10^{16}$ cm$^{-3}$ to about $2 \times 10^{17}$ cm$^{-3}$. Again, one skilled in the art can readily ascertain the energy and composition of a particle beam that will provide a concentration of recombination centers within the prescribed range.

According to a third exemplary embodiment of the invention, the epitaxial growth conditions of at least a portion of the InGaAsP waveguide layer 64 are modified so that a small density of native point defects are grown into the InGaAsP crystal lattice. This may be achieved, for example, by epitaxial growth of the material at a temperature that is lower than optimum for defect-free growth. The native point defects, for example vacancies, interstitial atoms or anti-site defects, act as centers for monomolecular recombination of carriers, to form defective waveguide 65. Other, larger defects such as dislocations may also act as recombination centers, but they are undesirable in practical optoelectronic devices because they can grow during operation of the device, causing unstable, unreliable operating characteristics. As in the first and second exemplary embodiments, the concentration of recombination centers is in the range of about $1 \times 10^{16}$ cm$^{-3}$ to about $1 \times 10^{18}$ cm$^{-3}$, more preferably in the range of about $2 \times 10^{16}$ cm$^{-3}$ to about $2 \times 10^{17}$ cm$^{-3}$. Again, one skilled in the art will be able to select materials and growth conditions that will provide recombination centers within the prescribed range.

Figure 13:
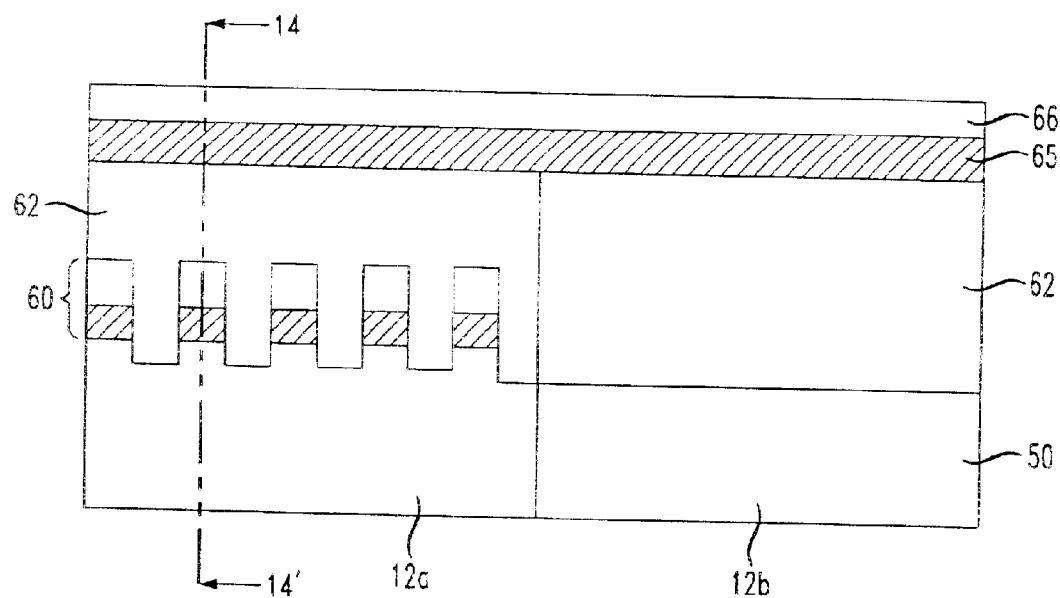
FIG. 13 illustrates a cross-sectional view of the laser device of FIG. 3 at a stage of processing subsequent to that shown in FIG. 10.
Figure 14:
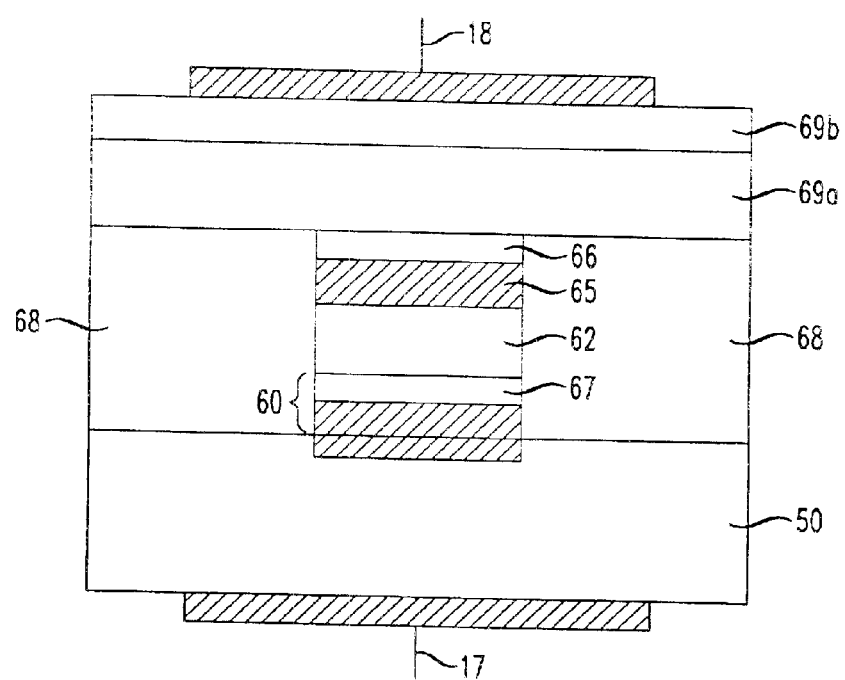
FIG. 14 illustrates a cross-sectional view of the laser device of FIG. 13 taken along line 14–14' and at a stage of processing subsequent to that shown in FIG. 13.

Referring now to FIGS. 13–14, conventional capped-mesa buried heterostructure (CMBH) process processing steps may be carried out to complete the formation of tuning region 70 (FIG. 15) having a small density of recombination centers in the waveguide layer 65, in the range of about $1 \times 10^{16}$ cm$^{-3}$ to about $1 \times 10^{18}$ cm$^{-3}$, more preferably in the range of about $2 \times 10^{16}$ cm$^{-3}$ to about $2 \times 10^{17}$ cm$^{-3}$. For a better understanding of the invention, FIG. 14 illustrates a cross-sectional view of the semiconductor laser device of FIG. 13 taken along lines 14–14'. In the CMBH process, a second p-InP cladding layer 66 (FIG. 13) about 0.5 micron thick is formed on waveguide layer 65, and then the layer stack comprising layers 66, 65, 62, 52 and a portion of substrate 50 are patterned into a mesa 67 (FIG. 14), and subsequently buried with InP blocking layers 68 (FIG. 14) to provide lateral current confinement and optical waveguiding. Mesa 67 (FIG. 14) is, for example, about 1 micron wide and about 3 microns deep. The InP blocking layers 68 may be n-type, p-type, intrinsic or semi-insulating InP.

As also shown in FIG. 14, p-type InP cap layer 69a and p+ InGaAs contact layer 69b are formed over the mesa 67 and the blocking layers 68. The thickness of p-InP cap layer 69a is about 2 to about 3 microns, and that of the p+ InGaAs contact layer 69b is of about 0.1 microns. Electrical contacts 17 and 18 (FIG. 14) are then formed on the p+ InGaAs layer 69b and the n-InP substrate 50 by known methods of the art. This way, electrical bias may be applied to the p-n junction formed by p-cladding layer 66, lightly-doped waveguide layer 65, and n-InP cladding layer 62. It is to be understood that many other processes could be used to form the lateral electrical and optical confinement of a tuning region having a small density of recombination centers in the waveguide layer 65, and thus the invention is not limited to the use of the CMBH process of the exemplary embodiment.

Figure 11:
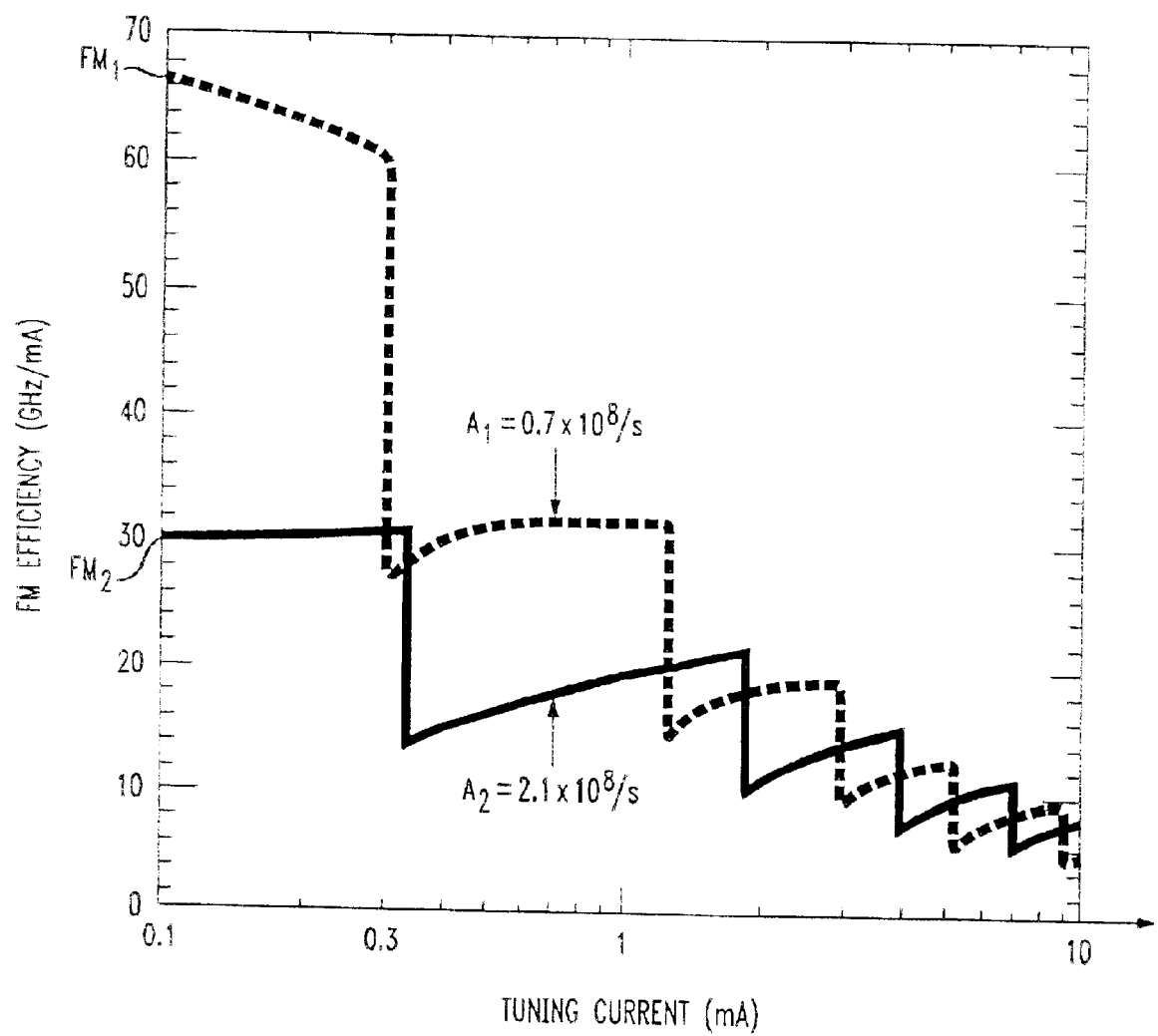
FIG. 11 illustrates the change in frequency modulation as function of the tuning current for the laser device of FIG. 10.

As explained in more detail below with reference to FIGS. 11 and 12, the inventors have discovered that, for tuning sections fabricated using the first exemplary embodiment, at the above-mentioned low doping concentration ranges, the monomolecular recombination rate is increased by a factor of about 3 and, thus, the immunity to noise is increased accordingly. For example, as illustrated in FIG. 11, over a low tuning current range of about 0.1 mA to about 1.0 mA, the linear coefficient $A_1 = 0.7 \times 10^8$/s (FIG. 11), corresponding to monomolecular recombination for a non-doped tuning region, is increased by a factor of about 3 to a linear coefficient $A_2 = 2.1 \times 10^8$/s (FIG. 11), corresponding to the monomolecular recombination for a very light iron-doping of the n-InGaAsP layer 64. This increase in the linear coefficient value reflects an improved immunity to noise at low current ranges.

As also shown in FIG. 11, the frequency modulation (FM) tuning efficiency also drops by a factor of about 2, from about $FM_1 = 67$ GHz/mA (corresponding to a non-doped tuning region with $A_1 = 0.7 \times 10^8$/s) to about $FM_2 = 30$ GHz/mA (corresponding to a very light iron-doped tuning region with $A_2 = 2.1 \times 10^8$/s). However, as illustrated in FIG. 11, this drop in the tuning efficiency has a significant value only over a low tuning current range, of about 0.1 mA to about 0.3 mA. Also shown in FIG. 11, at a tuning current greater than 0.3 mA, the effect in the reduction of the tuning efficiency becomes minimal as the frequency modulation (FM) is only slightly decreased. Thus, the overall tuning efficiency is not greatly affected while the increase in the linear coefficient triggers a great improvement in noise immunity of the laser device. Further, despite the decrease in the tuning efficiency for very light iron-doping, the number of tuning steps over the tuning current range remains the same for the doped tuning region as for the non-doped tuning region. As mentioned above, the very light doping of the present invention increases the monomolecular recombination by a factor of about 3. The concentration of recombination centers is in the range of about $1 \times 10^{16}$ cm$^{-3}$ to about $1 \times 10^{18}$ cm$^{-3}$, more preferably of about $2 \times 10^{16}$ cm$^{-3}$ to about $2 \times 10^{17}$ cm$^{-3}$.

Figure 12:
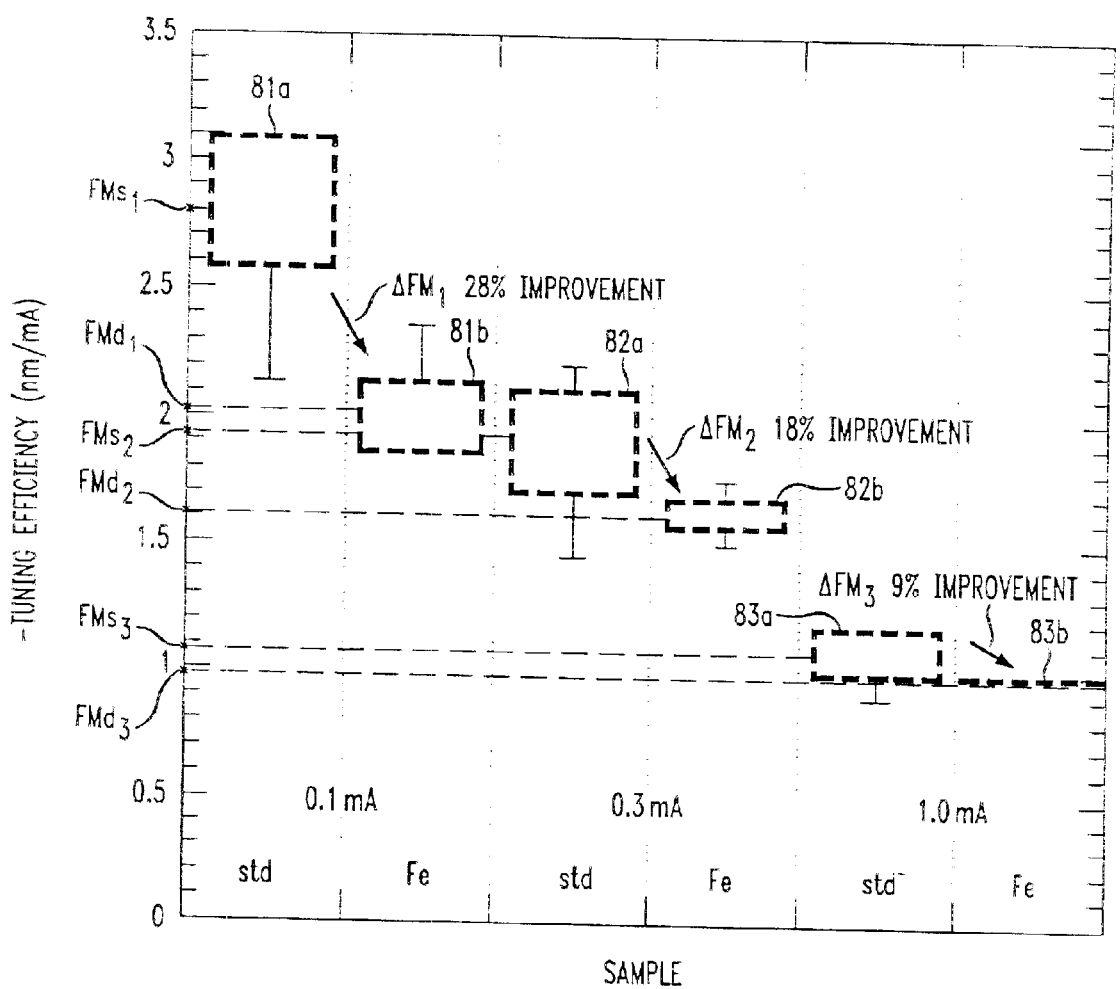
FIG. 12 illustrates the change in tuning efficiency as function of the tuning current for the laser device of FIG. 10.

The significant decrease in the tuning efficiency at a tuning current lower than about 0.3 mA in a lightly doped tuning region, as well as the modest decrease in the tuning efficiency at a tuning current greater than about 0.3 mA in the lightly doped tuning region, is further illustrated in FIG. 12. FIG. 12 illustrates a side-by-side comparison of collected tuning efficiency data for eight (8) standard non-doped wafers (the InGaAsP waveguide layer 64 is not doped) and that of six (6) iron (Fe)-doped wafers (the InGaAsP waveguide layer 64 is doped with iron in a concentration range of about $1 \times 10^{16}$ cm$^{-3}$ to about $1 \times 10^{18}$ cm$^{-3}$, more preferably of about $2 \times 10^{16}$ cm$^{-3}$ to about $2 \times 10^{17}$ cm$^{-3}$).

As shown in FIG. 12, for a tuning current of about 0.1 mA, 75% of the data for the 8 standard wafers corresponding to the tuning efficiency values fall within dotted area 81a (FIG. 12) and in between 2.6 nm–3.2 nm, with a median value $FMs_1 = 2.84$ nm. For the same tuning current of about 0.1 mA, 75% of the data for the 6 iron-doped wafers corresponding to the tuning efficiency values fall within dotted area 81b (FIG. 12) and between 1.8 nm–2.2 nm, with a median value $FMd_1 = 2.05$ nm. Accordingly, the reduction in the frequency modulation $\Delta FM_1$ for a tuning current of about 0.1 mA corresponding to a tuning region doped with iron having a dopant concentration in the range of about $1 \times 10^{16}$ cm$^{-3}$ to about $1 \times 10^{18}$ cm$^{-3}$, more preferably of about $2 \times 10^{16}$ cm$^{-3}$ to about $2 \times 10^{17}$ cm$^{-3}$, is $\Delta FM_1 = FMd_1/FMs_1$ or about 28%.

As also shown in FIG. 12, for a tuning current of about 0.3 mA, 75% of the data for the 8 standard wafers corresponding to the tuning efficiency values fall within dotted area 82a (FIG. 12) and between 1.7 nm–2.2 nm, with a median value $FMs_2 = 1.98$ nm. For the same tuning current of about 0.3 mA, 75% of the data for the 6 iron-doped wafers corresponding to the tuning efficiency values fall within dotted area 82b (FIG. 12) and between 1.6 nm–1.7 nm, with a median value $FMd_2 = 1.63$ nm. Accordingly, the reduction in the frequency modulation $\Delta FM_2$ for a tuning current of about 0.3 mA corresponding to a tuning region doped with iron having a dopant concentration range of about $1 \times 10^{16}$ cm$^{-3}$ to about $1 \times 10^{18}$ cm$^{-3}$, more preferably of about $2 \times 10^{16}$ cm$^{-3}$ to about $2 \times 10^{17}$ cm$^{-3}$, is of about $\Delta FM_2 = FMd_2/FMs_2$ or of about 18%, a value which is much smaller than $\Delta FM_1$.

As further illustrated in FIG. 12, for a tuning current of about 1.0 mA, 75% of the data for the 8 standard wafers corresponding to the tuning efficiency values fell within dotted area 83a (FIG. 12) between 1.0 nm–1.2 nm, with a median value $FMs_3 = 1.09$ nm. For the same tuning current of about 1.0 mA, 75% of the data for the 6 iron-doped wafers corresponding to the tuning efficiency values fell within dotted area 83b (FIG. 12) and between 0.9 nm–1.0 nm, with a median value $FMd_3 = 0.99$ nm. Accordingly, the reduction in the frequency modulation $\Delta FM_3$ for a tuning current of about 1.0 mA corresponding to a tuning region doped with iron having a dopant concentration range of about $1\times10^{16}$ cm$^{-3}$ to about $1\times10^{18}$ cm$^{-3}$, more preferably of about $2\times10^{16}$ cm$^{-3}$ to about $2\times10^{17}$ cm$^{-3}$, is of about $\Delta FM_3 = FMd_3/FMs_3$ or about 9%, a value which is much smaller than $\Delta FM_1$ and $\Delta FM_2$.

The above-identified data proves that the maximum reduction in the tuning efficiency ($\Delta FM_1$ of about 28%) of a tuning region very lightly doped with iron, in the ranges outlined above, is achieved at low current ranges, of about 0.1 mA to about 0.3 mA. As the tuning current increases, however, the reduction in the tuning efficiency decreases significantly so that at a tuning current of about 1.0 mA, $\Delta FM_3$ is only about 9%. Thus, the integrated effect on the entire tuning range is very small as the tuning current increases. Accordingly, the overall change in the tuning range is small and tolerable since the only modest change in tunability occurs only over low currents. The immunity to noise of the device is also greatly improved as the monomolecular recombination is increased.

Figure 15:
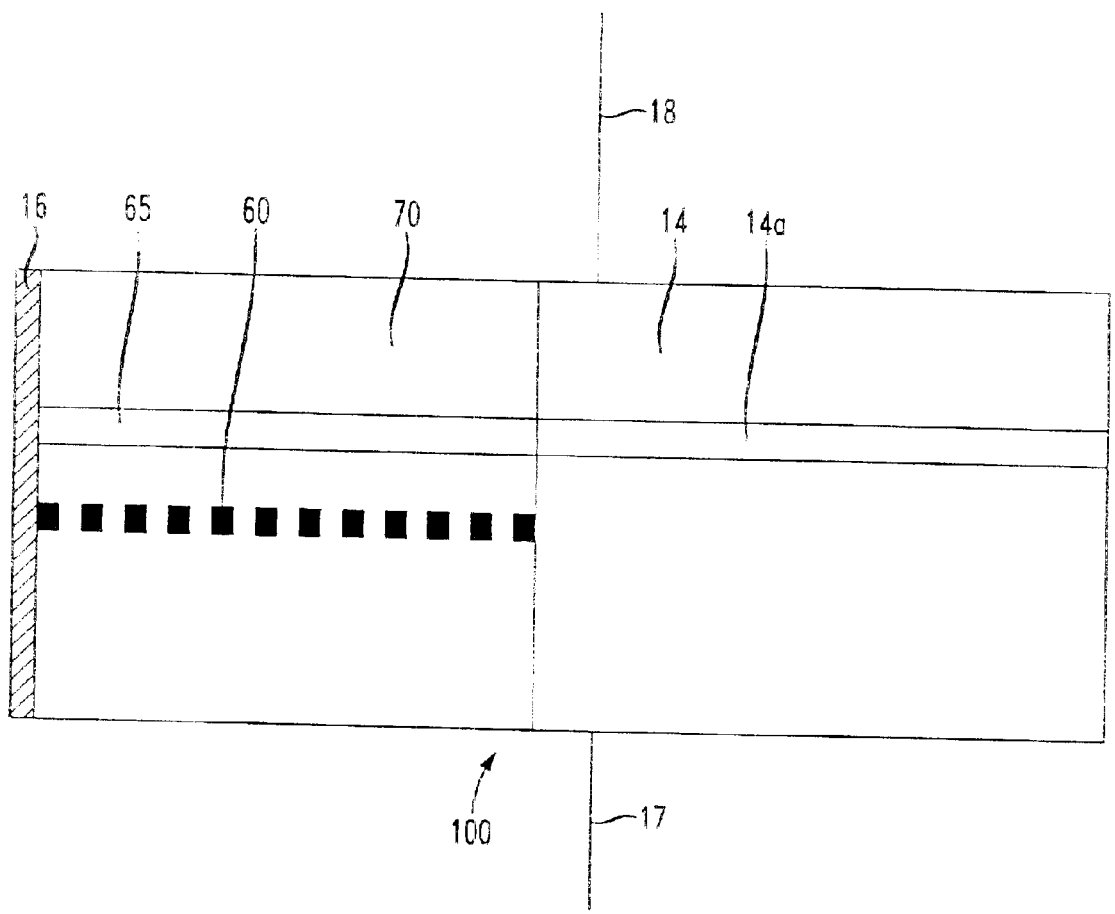
FIG. 15 illustrates a cross-sectional view of the laser device of FIG. 3 at a stage of processing subsequent to that shown in FIG. 13.

FIG. 15 illustrates a two-section DBR laser device 100 having a tuning region 70 constructed according to embodiments of the present invention and as described above with reference to FIGS. 3–14. The DBR laser device 100 of FIG. 15 further comprises the waveguide 65 having a small density of recombination centers and the grating 60 and, possibly, a facet coating 16. A gain section 14 with an active waveguide 14a, typically containing a multi-quantum well (MQW) stack, generates spontaneous emission and optical gain about an energy determined by the quantum well structure. With application of electrical current to the electrodes 17 and 18, a threshold is reached beyond which sufficient gain and the lasing action begins. By providing a concentration of recombination centers of about $1\times10^{16}$ cm$^{-3}$ to about $1\times10^{18}$ cm$^{-3}$ in the tuning region 70 of the DBR laser device 100, the immunity to noise is greatly increased. As explained above, the small density of recombination centers in the tuning region 70 increases monomolecular recombination over low current ranges. By increasing the monomolecular recombination over low current ranges, the immunity to noise is improved but the tuning efficiency is reduced. Nevertheless, only a minimal effect on the tuning efficiency is noted over high current ranges and, therefore, the overall tuning range is only insignificantly changed. Accordingly, the immunity to noise of the tunable DBR laser device 100 is increased with minimal sacrifice of the tuning range.

Figure 16:
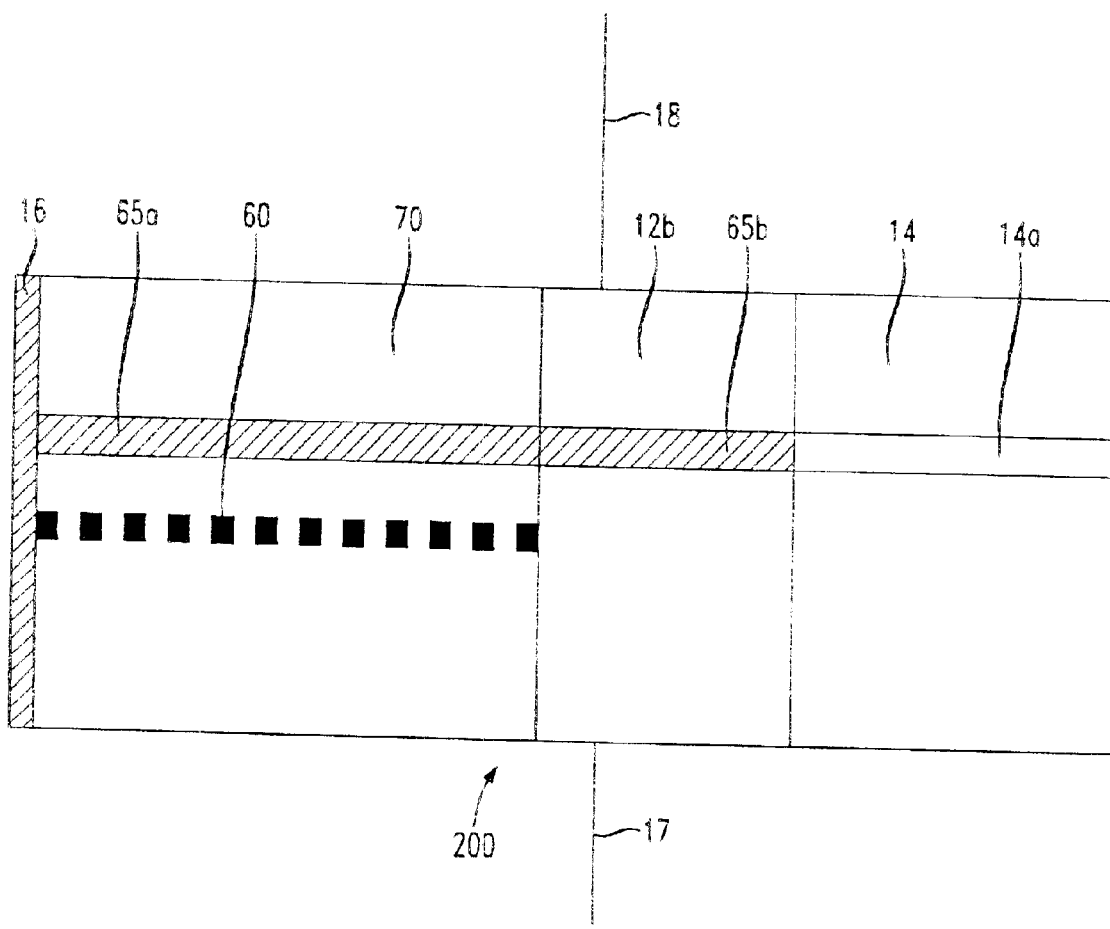
FIG. 16 illustrates a cross-sectional view of a three-section laser device formed in accordance with the present invention.

Although the embodiments described above illustrate a two-section laser device, such as the DBR laser device 100 of FIG. 15, it must be understood that the present invention is not limited to two-section laser devices. For example, FIG. 16 depicts a three-section DBR laser 200 in which tuning waveguide 65a and/or phase-tuning waveguide 65b have a small density of recombination centers in accordance with embodiments of the present invention to increase the monomolecular recombination in such waveguides. Phase-tuning section 12b of the three-section DBR laser 200 is used to adjust the round-tip optical phase in the laser cavity, so that the longitudinal cavity modes of the laser are aligned with the peak of the reflection from the DBR grating.

Although the embodiments described above illustrate a two-section and a three-section laser devices 100, 200 (FIGS. 15–16), it must be further understood that the present invention is not limited to laser devices and other optical devices which use a carrier-induced refractive index change in a semiconductor section may be used also, as long as they are designed specifically to take advantage of the improved noise immunity over low current ranges. Thus, the invention also contemplates optical intensity modulators, optical phase-shifters, tunable filters, interferometric modulators, amplifiers operating at low current, or any other optical device employing a tuning section.

Also, although the present invention refers to an exemplary n-type substrate on which operative layers form a tuning region, it is to be understood that the present invention also contemplates a p-type or semi-insulating substrate on which corresponding operative layers form a tuning region. Further, although the embodiments described above illustrate a grating region, for example the grating region 60 of FIGS. 8–10, located below the waveguide layer 64, the invention is not limited to this embodiment. Accordingly, the present invention also contemplates laser devices with a grating region located above, on the side of, or in direct contact with the waveguide layer formed according to the present invention and having the above-detailed range of concentration of recombination centers.

While the invention has been described and illustrated with reference to specific embodiments, the present invention is not limited to the details of the specific embodiments. Accordingly, the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A tuning region of a semiconductor optical device comprising:
   a substrate;
   a first cladding layer over said substrate;
   a waveguide layer provided over at least a portion of said substrate and said first cladding layer, at least a portion of said waveguide layer having a concentration of recombination centers in the range of about $1\times10^{16}$ cm$^{-3}$ to about $1\times10^{18}$ cm$^{-3}$, wherein said recombination centers are formed by doping said at least a portion of said waveguide layer with impurity atoms selected from the group consisting of iron, chromium, manganese and copper;
   a second cladding layer, said first and second cladding layers forming a p-n junction around said waveguide layer; and
   electrical contacts to said first and second cladding layers for providing a bias of said p-n junction for the purpose of injecting carriers into said waveguide layer.

2. The tuning region of claim 1, wherein said concentration of recombination centers is in the range of about $2\times10^{16}$ cm$^{-3}$ to about $2\times10^{17}$ cm$^{-3}$.

3. The tuning region of claim 1, wherein said semiconductor optical device is a DBR laser.

4. The tuning region of claim 1, wherein said semiconductor optical device is selected from the group consisting of lasers, optical intensity modulators, optical phase modulators and optical filters.

5. The tuning region of claim 1, wherein said substrate is InP, and said waveguide layer is InGaAsP.

6. The tuning region of claim 5 further comprising a grating layer provided over at least a portion of said InGaAsP wave guide layer.

7. The tuning region of claim 6 further comprising a second cladding layer, said first and second cladding layers forming a p-n junction around said InGaAsP waveguide layer.

8. An optoelectronic device comprising:

a substrate;

at least one tuning region;

a first cladding layer;

a waveguide layer of said at least one tuning region provided over at least a portion of said substrate and said cladding layer, at least a portion of said waveguide layer having a thickness of about 2,000 Angstroms, and at least 100 Angstroms of said waveguide layer having a concentration of recombination centers in the range of about $1\times10^{16}$ cm$^{-3}$ to about $1\times10^{18}$ cm$^{-3}$;

a second cladding layer, said first and second cladding layers forming a p-n junction around said waveguide layer, and electrical contacts to said first and second cladding layers, said electrical contacts providing a bias of said p-n junction for the purpose of injecting carriers into said waveguide layer.

9. The optoelectronic device of claim 8 further comprising a grating layer over said at least a portion of said waveguide layer.

10. A method of comprising:

forming a first cladding layer over a substrate of a semiconductor optical device;

forming a InGaAsP waveguide layer over said first cladding layer under conditions selected to provide a concentration of recombination centers in a range of about $1\times10^{16}$ cm$^{-3}$ to about $1\times10^{18}$ cm$^{-3}$ in said waveguide layer; and subjecting said device to said conditions selected to provide said recombination centers.

11. The method of claim 10, wherein said step of subjecting said device to said conditions selected to provide recombination centers includes lightly doping at least a portion of said waveguide layer.

12. The method of claim 11, wherein said at least a portion of said waveguide layer has a dopant concentration in the range of about $1\times10^{16}$ cm$^{-3}$ to about $1\times10^{18}$ cm$^{-3}$.

13. The method of claim 11, wherein said step of forming said waveguide layer is simultaneous with said step of lightly doping said at least a portion of said waveguide layer.

14. The method of claim 11, wherein said step of lightly doping said at least a portion of said waveguide layer is subsequent to said step of forming said waveguide layer.

15. The method of claim 10, wherein said step of subjecting said device to said conditions selected to provide recombination centers includes varying the growth conditions of at least a portion of said waveguide layer.

16. The method of claim 10, wherein said step of subjecting said device to said conditions selected to provide recombination centers includes irradiating at least a portion of said waveguide layer with high energy particles.

17. The method of claim 10, wherein said substrate is an InP substrate.

18. The method of claim 10 further comprising the step of forming a second cladding layer over said waveguide layer.

19. The method of claim 10 further comprising the step of forming a grating region over said substrate and below said waveguide layer.

* * * * *